United States Patent
Brorein et al.

(10) Patent No.: US 10,330,715 B2
(45) Date of Patent: Jun. 25, 2019

(54) SYSTEMS AND METHODS FOR DETERMINING A SELF-DISCHARGE CURRENT CHARACTERISTIC OF A STORAGE CELL

(71) Applicant: Keysight Technologies, Inc., Minneapolis, MN (US)

(72) Inventors: Edward Brorein, Cedar Knolls, NJ (US); Marko Vulovic, Columbia, NJ (US); Bryan Boswell, Loveland, CO (US); Robert Zollo, North Haledon, NJ (US)

(73) Assignee: Keysight Technologies, Inc., Santa Rosa, CA (US)

( * ) Notice: Subject to any disclaimer, the term of this patent is extended or adjusted under 35 U.S.C. 154(b) by 185 days.

(21) Appl. No.: 15/375,123

(22) Filed: Dec. 11, 2016

(65) Prior Publication Data
US 2018/0164363 A1 Jun. 14, 2018

(51) Int. Cl.
*G01R 31/02* (2006.01)
*G01R 31/36* (2019.01)
(Continued)

(52) U.S. Cl.
CPC .......... *G01R 31/025* (2013.01); *G01R 31/367* (2019.01); *G01R 31/3865* (2019.01); *G01R 31/396* (2019.01); *G01R 31/374* (2019.01)

(58) Field of Classification Search
CPC .............. G01R 31/025; G01R 31/3675; G01R 31/3651; G01R 31/3658
See application file for complete search history.

(56) References Cited

U.S. PATENT DOCUMENTS 6,160,382 A 12/2000 Yoon
8,570,047 B1* 10/2013 Davies .............. H01M 10/4207
324/434
(Continued)

FOREIGN PATENT DOCUMENTS

DE 102014209454 A1 11/2015
DE 102014209454 A1 11/2015
(Continued)

OTHER PUBLICATIONS

German Office Action dated Sep. 11, 2017 German Patent Application No. 102017201417.2.

*Primary Examiner* — Huy Q Phan
*Assistant Examiner* — Zannatul Ferdous

(57) ABSTRACT

In accordance with one illustrative embodiment, a system for determining a self-discharge current characteristic of a storage cell (or a bank of storage cells) includes a voltage source, first and second voltage measurement circuits, a current measurement circuit, and a processor. The voltage source provides a potentiostat voltage to the storage cell coupled to the system. The first voltage measurement circuit provides a first voltage resolution for measuring an open circuit voltage across a pair of terminals of the storage cell. The second voltage measurement circuit provides a second voltage resolution that is significantly higher than the first voltage resolution for measuring a terminal voltage at one of the pair of terminals of the storage cell. The processor executes a test procedure by using the voltage source, the first and second voltage measurement circuits, and the current measurement circuit, to determine the self-discharge leakage current characteristic of the storage cell.

20 Claims, 5 Drawing Sheets

(51) Int. Cl.
  *G01R 31/367* (2019.01)
  *G01R 31/396* (2019.01)
  *G01R 31/385* (2019.01)
  *G01R 31/374* (2019.01)

(56) References Cited

U.S. PATENT DOCUMENTS

| | | | |
|---|---|---|---|
| 9,496,962 B1* | 11/2016 | Wang | H04B 10/5053 |
| 2004/0128086 A1* | 7/2004 | Barsoukov | G01R 31/3651 |
| | | | 702/63 |
| 2005/0154544 A1* | 7/2005 | Ono | G01R 31/361 |
| | | | 702/63 |
| 2005/0200411 A1* | 9/2005 | Chang | H03F 3/45183 |
| | | | 330/253 |
| 2009/0157128 A1* | 6/2009 | Seim | A61N 1/3621 |
| | | | 607/4 |
| 2014/0049227 A1* | 2/2014 | Martin | H01M 10/0525 |
| | | | 320/162 |
| 2014/0266229 A1 | 9/2014 | McCoy | |
| 2017/0005574 A1* | 1/2017 | Wyland | H02M 3/156 |
| 2017/0153290 A1* | 6/2017 | Sazhin | G01R 31/003 |

FOREIGN PATENT DOCUMENTS

| | | |
|---|---|---|
| DE | 102014215290 A1 | 2/2016 |
| DE | 102014215298 A1 | 2/2016 |
| EP | 2 179 297 B1 | 12/2014 |
| JP | 2013185861 A | 9/2013 |

* cited by examiner

SYSTEMS AND METHODS FOR DETERMINING A SELF-DISCHARGE CURRENT CHARACTERISTIC OF A STORAGE CELL

BACKGROUND

A storage cell, such as a nickel-cadmium (NiCad) cell or a lithium ion cell, typically loses its charge over a period of time, primarily as result of a self-discharge current that occurs in the storage cell. Unfortunately, given the current state of the art, it is practically impossible to completely eliminate the self-discharge current in these storage cells. Furthermore, while there has been a limited level of success in testing individual storage cells in a laboratory environment, it is turning out to be quite complex and impractical to measure the self-discharge current characteristics of each of a batch of storage cells in a manufacturing environment.

More particularly, measuring the self-discharge current parameters of each of a batch of lithium ion cells during manufacture is turning out to be impractical due to a variety of reasons. Some of these reasons include shortcomings associated with existing lithium storage cell technologies, while other shortcomings are associated with commercially available potentiostat systems used for carrying out these types of measurements. The shortcomings associated with commercially available potentiostat systems, particularly those used for characterizing lithium ion cells that are larger than button cells, can include complexity, insufficient accuracy, and undesirably high cost.

Consequently, in lieu of batch testing lithium ion cells on a manufacturing floor, some test entities have opted to use an alternative approach wherein an open circuit voltage of each of a batch of lithium ion cells is measured prior to storing the batch of lithium ion cells in a controlled temperature facility. In many cases, the storage period can extend to a couple of weeks or longer. Upon completion of the storage period, the open circuit voltage of each lithium ion cell is measured once again in order to evaluate the self-discharge current characteristics of each lithium ion cell on the basis of a drop in the open circuit voltage as a result of the storage. As can be understood, not only does such a procedure merely provide an approximation of the self-discharge current characteristic of each lithium ion cell but also suffers from various other shortcomings such as the testing period having to extend over a couple of weeks or longer, storage requirements (including controlled environmental conditions), and potential hazards (fire hazard, chemical leaks, toxic emissions etc.) during storage.

SUMMARY

Certain embodiments of the disclosure can provide a technical effect and/or solution to determine a self-discharge current characteristic of one or more rechargeable storage cells within a short period of time (a few hours, for example) and by using test elements and techniques that provide a very attractive cost-to-accuracy ratio in comparison to traditional measurement systems.

According to one exemplary embodiment of the disclosure, a method can include: measuring an open circuit voltage across a pair of terminals of a storage cell (or a bank of storage cells) by using a first voltage measurement circuit that provides a first voltage resolution; providing to the one of the storage cell or the bank of storage cells, a first potentiostat voltage that is determined at least in part by using the open circuit voltage measured using the first voltage measurement circuit; measuring a terminal voltage at one of the pair of terminals of the storage cell (or the bank of storage cells) by using a second voltage measurement circuit configured to provide a second voltage resolution that is higher than the first voltage resolution; providing to the storage cell (or the bank of storage cells), a second potentiostat voltage that is based at least in part on the terminal voltage measured using the second voltage measurement circuit; executing one or more self-discharge leakage current measurements upon the storage cell (or the bank of storage cells) over a period of time after providing the second potentiostat voltage to the storage cell (or the bank of storage cells); and using the one or more self-discharge leakage current measurements to determine a self-discharge leakage current characteristic of the storage cell (or the bank of storage cells).

According to another exemplary embodiment of the disclosure, a method can include: executing a temperature coefficient of voltage (TCV) characterization procedure upon a storage cell (or a bank of storage cells) for determining a TCV characteristic of the storage cell (or the bank of storage cells) and using the TCV characteristic to set an initial state-of-charge (SOC) level of the storage cell (or the bank of storage cells) prior to executing a test procedure for determining a self-discharge leakage current characteristic of the storage cell (or the bank of storage cells). The test procedure can include: providing two or more voltage measurement circuits; using a first of the two or more voltage measurement circuits to measure an open circuit voltage across a pair of terminals of the storage cell (or the bank of storage cells), the first voltage measurement circuit providing a first voltage resolution; providing to the storage cell (or the bank of storage cells), a first potentiostat voltage that is determined at least in part by using the open circuit voltage measured using the first voltage measurement circuit; executing one or more self-discharge leakage current measurements upon the storage cell (or the bank of storage cells) over a period of time after providing the first potentiostat voltage to the storage cell (or the bank of storage cells); and using the self-discharge leakage current measurements to determine the self-discharge leakage current characteristic of the storage cell (or the bank of storage cells).

According to yet another exemplary embodiment of the disclosure, a system can include a first voltage measurement circuit, a second voltage measurement circuit, a current measurement circuit, and a processor. The first voltage measurement circuit provides a first voltage resolution for measuring an open circuit voltage across a pair of terminals of a storage cell (or a bank of storage cells). The second voltage measurement circuit provides a second voltage resolution for measuring a terminal voltage at one of the pair of terminals of the storage cell (or the bank of storage cells). The current measurement circuit can be used for measuring one or more self-discharge leakage currents of the storage cell (or the bank of storage cells). The processor is coupled to the first voltage measurement circuit, the second voltage measurement circuit, and the current measurement circuit, for executing a test procedure to determine a self-discharge leakage current characteristic of the storage cell (or the bank of storage cells).

Other embodiments and aspects of the disclosure will become apparent from the following description taken in conjunction with the following drawings.

BRIEF DESCRIPTION OF THE FIGURES

Many aspects of the invention can be better understood by referring to the following description in conjunction with the accompanying claims and figures. Like numerals indicate like structural elements and features in the various figures. For clarity, not every element may be labeled with numerals in every figure. The drawings are not necessarily drawn to scale; emphasis instead being placed upon illustrating the principles of the invention. The drawings should not be interpreted as limiting the scope of the invention to the example embodiments shown herein.

DETAILED DESCRIPTION

Figure 1:
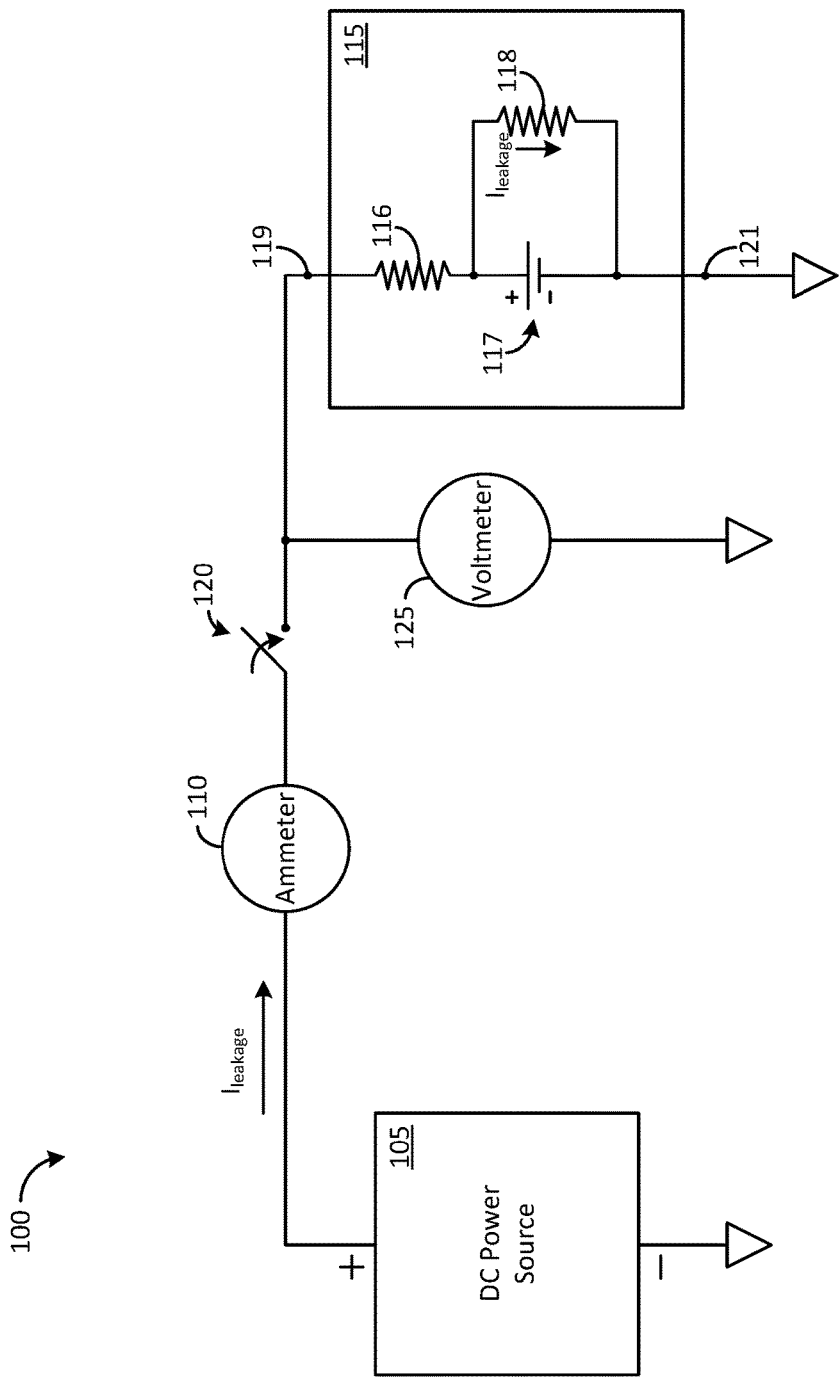
FIG. 1 shows an idealized set-up to measure a self-discharge current in a storage cell.

Throughout this description, embodiments and variations are described for the purpose of illustrating uses and implementations of inventive concepts. The illustrative description should be understood as presenting examples of inventive concepts, rather than as limiting the scope of the concepts as disclosed herein. Towards this end, certain words and terms are used herein solely for convenience and such words and terms should be broadly understood as encompassing various objects and actions that are generally understood in various forms and equivalencies by persons of ordinary skill in the art. For example, words such as "storage cell," "charge," "voltage," "processor," "computer," "amplifier," "accuracy," "resolution," "accuracy," "gain," "bank," "set," or "number" can have various interpretations and can be implemented in various ways without detracting from the spirit of the disclosure. More particularly, the phrase "storage cell" as used herein is not necessarily limited to a single storage cell but can be applied equally well to a bank/set/number of storage cells, and the phrase "test procedure" can be alternatively interpreted as indicating a "measurement procedure" when measurements are being carried out. It should also be understood that the word "example" as used herein is intended to be non-exclusionary and non-limiting in nature. More particularly, the word "exemplary" as used herein indicates one among several examples and it should be understood that no special emphasis, exclusivity, or preference, is associated or implied by the use of this word.

Generally, in accordance with the various illustrative embodiments disclosed herein, a system for determining a self-discharge current characteristic of a storage cell (or a bank of storage cells) can include a first voltage measurement circuit, a second voltage measurement circuit, a voltage source, a current measurement circuit, and a processor. The first voltage measurement circuit provides a first voltage resolution for measuring an open circuit voltage across a pair of terminals of the storage cell coupled to the system. The second voltage measurement circuit provides a second voltage resolution that is significantly higher than the first voltage resolution and can be used for measuring a terminal voltage at one of the pair of terminals of the storage cell after a first voltage measurement is obtained using the first voltage measurement circuit. The voltage source provides potentiostat voltages based on various voltage measurements carried out upon the storage cell by each of the first voltage measurement circuit and the second voltage measurement circuit. The current measurement circuit enables self-discharge leakage current measurements of the storage cell at various times. The processor can use the first voltage measurement circuit, the second voltage measurement circuit, the voltage source, and the current measurement circuit to execute a test procedure to determine a self-discharge leakage current characteristic of the storage cell. Such a system provides an advantageous cost-to-accuracy ratio in comparison to traditional self-discharge leakage current measurement systems. In some example implementations, the systems and methods disclosed herein can be used to identify one or more storage cells (in a batch of storage cells, for example) having a higher-than-typical self-discharge current which is an indicator of latent defects and/or contamination.

Attention is now drawn to FIG. 1, which shows an idealized set-up 100 to measure a self-discharge current in a storage cell 115. The idealized set-up 100 includes a direct current (DC) power source 105, an ammeter 110, a switch 120, a voltmeter 125, and a storage cell 115. The DC power source 105, which can also be referred to as a potentiostat, provides a potentiostat voltage that is referenced to ground and can be varied in order to match an open circuit voltage of the storage cell 115. The storage cell 115 can be any one of various types of cells that can be charged by the DC power source 105. In one exemplary embodiment, the storage cell 115 is a rechargeable lithium ion cell that is also referenced to ground and symbolically represented by an ideal cell 117, a first resistor 116 and a second resistor 118. The first resistor 116 represents an effective series resistance (ESR) of the storage cell 115 and the second resistor 118 represents a leakage resistor that contributes to a leakage current propagating through the storage cell 115. The leakage current can be alternatively referred to in this disclosure as a self-discharge current.

A measurement procedure for measuring a self-discharge current in the storage cell 115 can be carried out by first placing the switch 120 in an open condition thereby disconnecting the DC power source 105 from the storage cell 115. An open circuit voltage of the storage cell 115 is measured between node 119 and node 121 by using the voltmeter 125. The DC power source 105 is adjusted to provide a potentiostat voltage that matches the open circuit voltage. The switch 120 is then closed so as to connect the DC power source 105 to the storage cell 115. Ideally, at this time, there is no current flow through the ammeter 110 because the potentiostat voltage perfectly matches the measured open circuit voltage of the storage cell 115.

However, after a period of time, such as for example, a few days, the voltage of the cell begins to drop as a result of a flow of leakage current in the storage cell 115. The drop in the voltage is countered by the potentiostat voltage provided by the DC power source 105 that tends to maintain the storage cell 115 at the measured open circuit voltage. At an equilibrium condition, the DC power source 105 provides the entire amount of leakage current flowing through the storage cell 115 and this leakage current can be measured by the ammeter 110. The current measurements can be conducted at various moments over a desired period of time in order to determine the self-discharge current characteristics of the storage cell 115.

Unfortunately, the idealized set-up 100 described above is not satisfactory in real life because there are several factors that can come into play and adversely affect the measurement results. Firstly, the process of setting up the DC power source to provide an accurate potentiostat voltage that closely matches the open circuit voltage of the storage cell 115 (down to microvolt levels, for example) can be a complicated procedure requiring the use of high accuracy/high resolution measurement circuitry. Secondly, even if an acceptable level of voltage matching is achieved initially, the open circuit voltage of the storage cell 115 and/or the voltage provided by the DC power source 105 can change over time due to factors other than the self-discharge current (temperature variations and drift, for example) and it can be very difficult to track and compensate for such factors.

Furthermore, whenever a mismatch occurs between the potentiostat voltage and the open circuit voltage of the storage cell 115 due to any of these various factors, the extremely low resistance present in the current flow path (predominantly due to resistor 116) results in a significant amount of current being drawn by the storage cell 115 from the DC power source 105. This current can be very large in comparison to the leakage current of the storage cell 115 and thus rule out the possibility of making accurate measurements of the leakage current.

Figure 2:
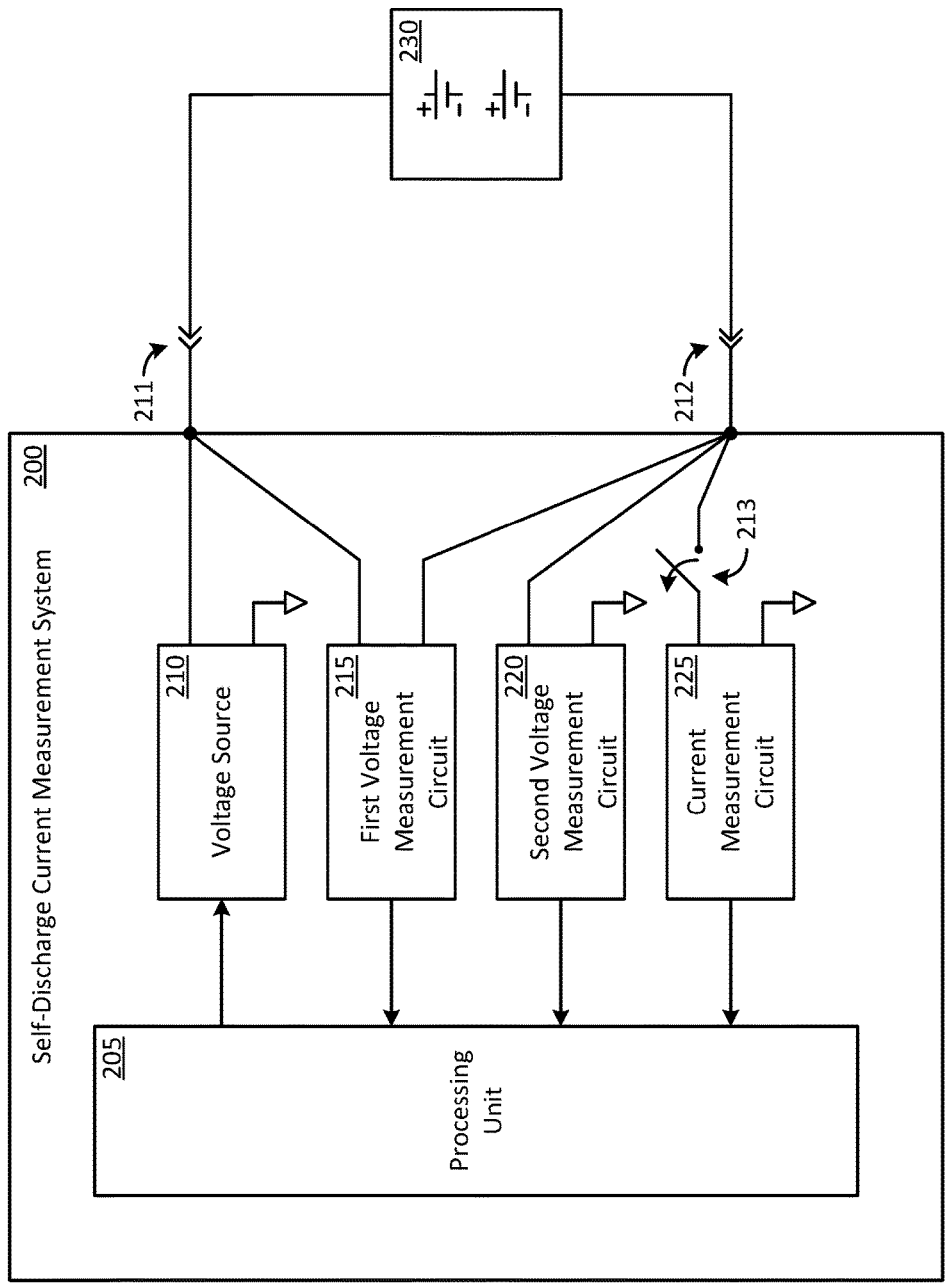
FIG. 2 shows an exemplary embodiment of a self-discharge current measurement system that can be used for determining a self-discharge current characteristic of a storage cell in accordance with the disclosure.

FIG. 2 shows an exemplary embodiment of a self-discharge current measurement system 200 that can be used for determining a self-discharge current characteristic of a storage cell 230 in accordance with the disclosure. More particularly, the self-discharge current measurement system 200 can be used to address at least some of the challenges presented by the exemplary set-up 100, and in contrast to various traditional systems that can be only used upon small storage cells (such as button cells), the self-discharge current measurement system 200 can be used either upon a single large storage cell or upon a bank of large storage cells. The cost advantages as well as performance advantages offered by the self-discharge current measurement system 200 can also be used to simultaneously test a batch of storage cells using a number of such systems in a parallel manner. In contrast, many traditional self-discharge current measurement systems, some of which can be quite expensive, may necessitate testing a batch of storage cells in a sequential manner that not only prolongs the duration of the overall testing but also adds cost in other ways (storage facilities, controlled temperature requirements, etc.)

In some embodiments, the bank of storage cells can be provided in a series configuration, whereby an effective open circuit voltage of, for example, a set of six 4V storage cells is equal to 24 volts. In some other embodiments, the bank of storage cells can be provided in a parallel configuration, whereby an effective open circuit voltage of a set of six 4V storage cells for example, is equal to 4 volts. However, in the parallel configuration, an amplitude of the self-discharge current drawn from the self-discharge current measurement system 200 can be roughly equivalent to six times the amplitude of current drawn by a single storage cell.

The self-discharge current measurement system 200 includes various functional elements such as a voltage source 210, a first voltage measurement circuit 215, a second voltage measurement circuit 220, a current measurement circuit 225, and a processing unit 205. The processing unit 205 can be implemented in the form of a computer that includes various components such as a processor, input/output interfaces, and storage devices (memory devices, for example). More particularly, the storage devices can include a non-transitory computer storage medium for storing an operating system (OS) and one or more application programs that are executable by the processor for implementing the exemplary methods, features, and aspects disclosed herein.

The voltage source 210 can include one or more voltage generation elements that are configurable by the processing unit 205 for providing a potentiostat voltage that is referenced to ground and coupled into the storage cell 230 via an output terminal 211 of the self-discharge current measurement system 200.

The first voltage measurement circuit 215, which is coupled to the storage cell 230 via the output terminal 211 as well as another output terminal 212 of the self-discharge current measurement system 200, provides a first voltage resolution for measuring an open circuit voltage present across the positive and negative terminals of the storage cell 230. The first voltage resolution allows the processing unit 205 to carry out a measurement of an open circuit voltage of the storage cell 230 with millivolt level accuracy, for example. Thus, the processing unit 205 can use the first voltage measurement circuit 215 to identify the storage cell 230 as a 4V storage cell with an open circuit voltage of 4.305 V, for example. The processing unit 205 then uses the measured open circuit voltage to initially set the potentiostat voltage of the voltage source 210 at a voltage amplitude that matches the measured open circuit voltage. In this example, the processing unit 205 sets the potentiostat voltage of the voltage source 210 to 4.305V.

Using the first voltage measurement circuit 215 to measure the open circuit voltage of the storage cell 230 allows for a relatively close match between the potentiostat voltage and the open circuit voltage of the storage cell 230 (to a millivolt level, in this example). However, the actual open circuit voltage of the storage cell 230 may be, for example, 4.305375V rather than 4.305V, and the 375 microvolts level of mismatch between the potentiostat voltage and the open circuit voltage of the storage cell 230 can possibly result in a significant current flow through the storage cell 230 that prevents accurate measurement of a self-discharge current flow.

The voltage mismatch issue is addressed by using the second voltage measurement circuit 220, which is coupled to the storage cell 230 via the output terminal 212 and can be used for measuring a terminal voltage of the storage cell 230 with reference to ground. In this exemplary embodiment, the second voltage measurement circuit 220 can be used to measure a voltage at the negative terminal of the storage cell 230 with reference to ground. It should be noted that when using the first voltage measurement circuit 215 or the second voltage measurement circuit 220 to carry out any of the voltage measurements disclosed herein, it is preferable that the switch 213 be placed in an open condition so as to disconnect the current measurement circuit 225 from the storage cell 230. Disconnecting the current measurement circuit 225 from the storage cell 230 not only prevents an undesirable current flow at this stage of the measurement procedure, but also prevents any adverse effects that may occur as a result of an impedance path presented by the current measurement circuit 225 with respect to ground.

As a result of using the first voltage measurement circuit 215 to initially set the potentiostat voltage provided by the voltage source 210, the voltage across the positive and negative terminals of the storage cell 230 will match the potentiostat voltage (4.305V) provided by the voltage source 210 with reference to ground. The mismatch voltage (4.305375V−4.305V=375 µV) that appears between the negative terminal of the storage cell 230 and ground, is measured by using the second voltage measurement circuit 220. The second voltage measurement circuit 220 provides a second voltage resolution that is significantly higher than the first voltage resolution and offers a higher level of measurement granularity. Thus, the second voltage resolution allows the processing unit 205 to use the second voltage measurement circuit 220 to identify the storage cell 230 as having an open circuit voltage of 4.305375V. The processing unit 205 can then change the potentiostat voltage provided by the voltage source 210 to match the open circuit voltage of the storage cell 230 down to microvolt levels of accuracy.

The entire process of using the first voltage measurement circuit 215 and the second voltage measurement circuit 220 to accurately set the potentiostat voltage provided by the voltage source 210 to the storage cell 230 can be carried out over a very short period of time, such as in about a minute.

In some implementations, a current initialization procedure can be executed after the potentiostat voltage is provided to the storage cell 230 for the first time. The current initialization procedure, which is described below in more detail, allows for using the voltage source 210 to provide one or more potentiostat voltages that rapidly set an initial current flow into the storage cell 230 at a desired value prior to determining a self-discharge current characteristic of the storage cell 230. For example, in one implementation, the value of the initial current can be set to match a typical self-discharge current of the storage cell 230. The typical self-discharge current of the storage cell 230 can be determined beforehand based on parameters such as past history, previous test evaluations, data sheets, empirical data, and/or theoretical data. Setting the initial current in the storage cell 230 to a desired value (in about a minute for example), allows for a significant reduction in the overall duration of a test, particularly in comparison to several traditional test procedures.

After setting of the potentiostat voltage (with or without the current initialization procedure being included), a waiting period (an hour, for example) is provided to allow the storage cell 230 to reach an equilibrium condition. When the equilibrium condition is reached, the processing unit 205 uses the current measurement circuit 225 to measure an amplitude of a self-discharge current flowing through the storage cell 230. The self-discharge leakage current measurement procedure can be subsequently repeated several times (over a period of time) in order to determine the self-discharge leakage current characteristics of the storage cell 230.

The circuit elements used for implementing each of the first voltage measurement circuit 215 and the second voltage measurement circuit 220 for carrying out the two-step voltage measurement procedure described above can be relatively low-cost items, thereby providing a cost savings in comparison to a self-discharge current measurement system that employs a single high-resolution voltage measurement circuit for executing a one-pass voltage measurement down to microvolts level, for example.

Figure 3:
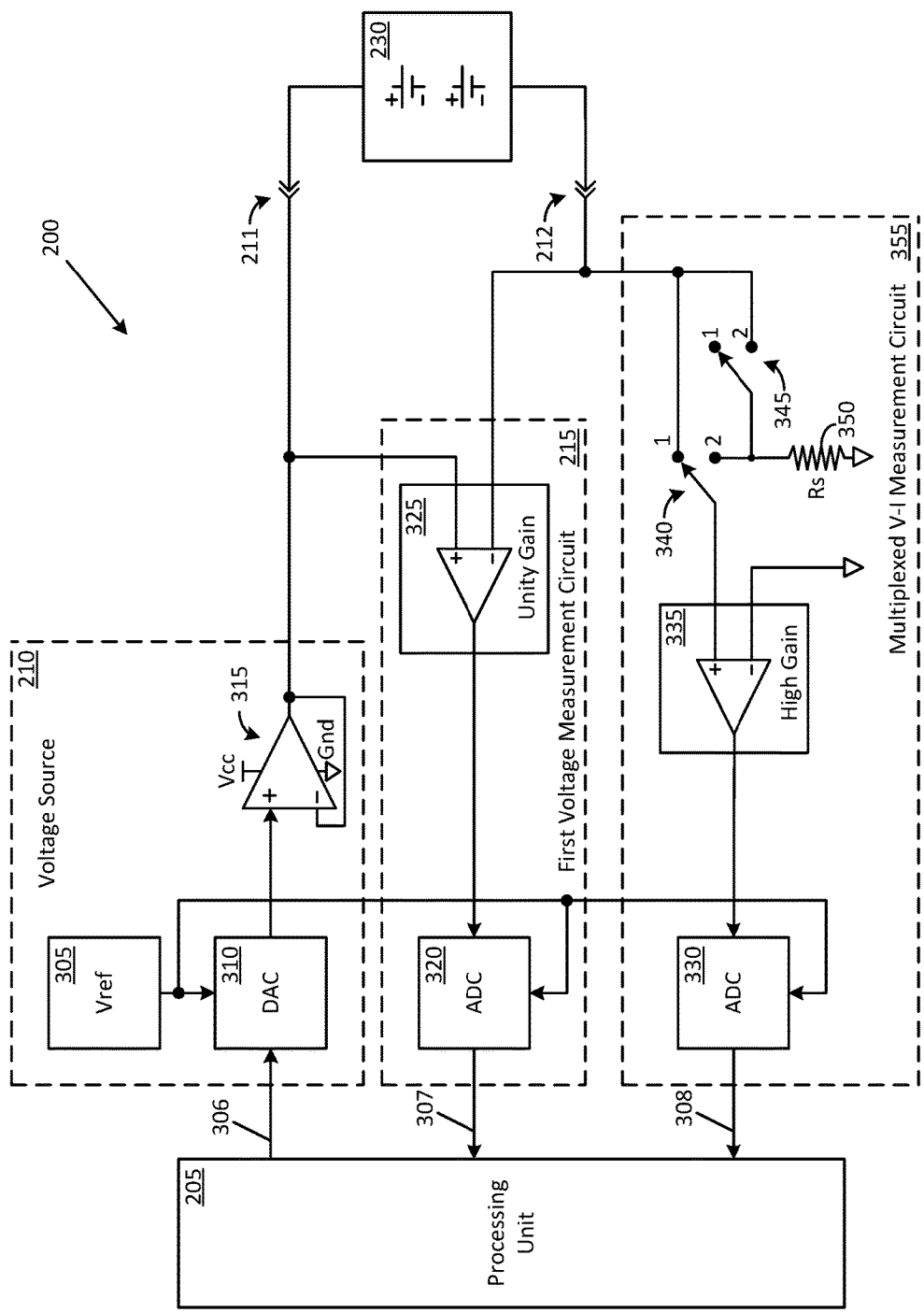
FIG. 3 shows some exemplary components that can be used to implement the self-discharge current measurement system shown in FIG. 2.

FIG. 3 shows some exemplary components that can be used to implement the self-discharge current measurement system 200 in accordance with one exemplary embodiment of the disclosure. The voltage source 210 includes a reference voltage element (Vref) 305, a digital-to-analog converter DAC 310, and a buffer amplifier 315. The reference voltage element 305, which is typically an oven-controlled voltage source and can include one or more Zener diodes, provides a reference voltage that is very stable over a range of operating temperatures. This reference voltage is provided to the DAC 310 for generating an analog voltage under control of a digital control word provided by the processing unit 205 to the DAC 310 via a binary interface 306. In various embodiments, the DAC 310 as well as the other elements of the voltage source 210 can be implemented using off-the-shelf components or in the form of custom-built circuits, and provide potentiostat voltages at a microvolt level of precision (or better). This level of precision is desirable, particularly in view of the microvolt level (or better) of measurement accuracy provided by the second voltage measurement circuit 220.

The digital word is set by the processing unit 205 in accordance with a two-pass voltage measurement procedure that is executed by the first voltage measurement circuit 215 and the second voltage measurement circuit 220. The analog voltage generated by the DAC 310, which is driven out by the buffer amplifier 315 into line 301, constitutes a potentiostat voltage that is referenced to ground and applied to the storage cell 230.

The first voltage measurement circuit 215 includes a unity gain amplifier 325 and an analog-to-digital converter (ADC) 320. The unity gain amplifier 325 provides for a one-to-one measurement of an open circuit voltage of the storage cell 230. The open circuit voltage of the storage cell 230 is coupled into the ADC 320. In some embodiments, the unity gain amplifier 325 can be replaced with a low gain amplifier. The low gain amplifier can be selected on the basis of a variety of factors such as an available operating voltage range and/or system trade-offs between cost and accuracy. The ADC 320, which can be a relatively low-cost element such as a 12-bit ADC, converts the voltage output of the unity gain amplifier 325 into a digital word that is coupled into the processing unit 205 via a binary interface 307. The combination of the unity gain amplifier 325 and the ADC 320 provide for a first voltage resolution when measuring the open circuit voltage of the storage cell 230. In one exemplary implementation, the combination of the unity gain amplifier 325 and the ADC 320 provide for a millivolts level of voltage resolution.

It may be pertinent to point out that in contrast to the self-discharge current measurement system 200 shown in FIG. 2, where the second voltage measurement circuit 220 and the current measurement circuit 225 are shown as separate functional blocks, the self-discharge current measurement system 200 shown in FIG. 3 incorporates a dual-function circuit in the form of the multiplexed V-I (voltage-current) circuit 355. The multiplexed V-I circuit 355 executes one or more functions of the second voltage measurement circuit 220 and the current measurement circuit 225 on a time-multiplexed basis. The multiplexed V-I circuit 355, which is feasible because the second voltage measurement of the storage cell 230 and the self-discharge current measurement of the storage cell 230 are typically performed at different times, can provide for a cost savings in the hardware used to implement the self-discharge current measurement system 200.

The multiplexed V-I circuit 355 includes a high gain amplifier 335, an analog-to-digital converter (ADC) 330, a current sense resistor 350, a first switch 340, and a second switch 345. Typically, the gain of high gain amplifier 335 exceeds 10, and in one exemplary implementation, the gain provided by the high gain amplifier 335 can range anywhere from 100 to 1000. The ADC 330, which can be a relatively low-cost element such as a 12-bit ADC, converts the voltage output of the high gain amplifier 335 into a digital word that is coupled into the processing unit 205 via a binary interface 308. The combination of the high gain amplifier 335 and the ADC 330 provide for a second voltage resolution when measuring the terminal voltage of the storage cell 230. In one exemplary implementation, the combination of the high gain amplifier 335 and the ADC 330 provide for a microvolts level of voltage resolution.

When carrying out the measurement of the terminal voltage, the multiplexed V-I circuit 355 is configured to operate in a voltage measurement mode by placing each of the switch 340 and the switch 345 to switch position 1 under control of the processing unit 205. In this configuration, the negative terminal of the storage cell 230 is coupled into a positive input terminal of the high gain amplifier 335 and the current sense resistor 350 is left in an open condition (disconnected from the high gain amplifier 335).

The processing unit 205 receives the digital word representing the terminal voltage of the storage cell 230 and uses the terminal voltage measurement to calculate and to provide a digital word to the DAC 310 via the binary interface 306. The DAC 310 responds to the digital word by generating a new potentiostat voltage that is coupled into the storage cell 230 via the buffer amplifier 315 and the line 301. In some implementations, the new potentiostat voltage can be set by the processing unit 205 based on an iterative and/or recursive procedure using the voltage source 210, the first voltage measurement circuit 215, and the multiplexed V-I circuit 355.

The storage cell 230 is then allowed to rest for some time to allow charge redistribution within the storage cell 230 (or the bank of cells) before the multiplexed V-I circuit 355 is used to execute self-discharge current measurements. The rest time, which can extend for several days in some instances, allows the storage cell 230 to reach a desirable equilibrium condition prior to execution of the self-discharge current measurements.

When performing the self-discharge current measurements, the multiplexed V-I circuit 355 is configured to operate in a current measurement mode by placing each of the switch 340 and the switch 345 to switch position 2 under control of the processing unit 205. In this configuration, the negative terminal of the storage cell 230 is coupled into the positive input terminal of the high gain amplifier 335 and the current sense resistor 350 is also connected to the positive input terminal of the high gain amplifier 335. The self-discharge current flowing through the storage cell 230 passes through the current sense resistor 350 to ground and the high gain amplifier 335 amplifies the resulting voltage drop across the current sense resistor 350. The output voltage of the high gain amplifier 335 is thus directly proportional to an amplitude of the self-discharge current flowing through the storage cell 230 and the current sense resistor 350.

Selecting a resistance value of the current sense resistor 350 is a trade-off between measurement sensitivity and measurement time because of a time constant factor attributable to the current sense resistor 350 operating in conjunction with a very large capacitance of the storage cell 230. As can be understood, a lower resistance value of the current sense resistor 350 translates to a faster measurement time at the expense of measurement sensitivity, and vice-versa. In one exemplary implementation, the current sense resistor 350 is selected to be about 1 ohm, which can provide for an optimal trade-off between measurement sensitivity and measurement time. More particularly, the measurement sensitivity can be directed towards addressing undesirable influences such as temperature and drift induced effects.

It should be noted that in the exemplary embodiment shown in FIG. 2, the terminal voltage of the storage cell 230 is measured by the multiplexed V-I circuit 355 at the negative terminal of the storage cell 230 with reference to ground. However, in another exemplary embodiment, the multiplexed V-I circuit 355 can be arranged to measure the terminal voltage of the storage cell at the positive terminal of the storage cell 230 (with reference to ground) when the storage cell 230 is flipped around and the voltage source 210 provides a potentiostat voltage of a negative polarity.

Figure 4:
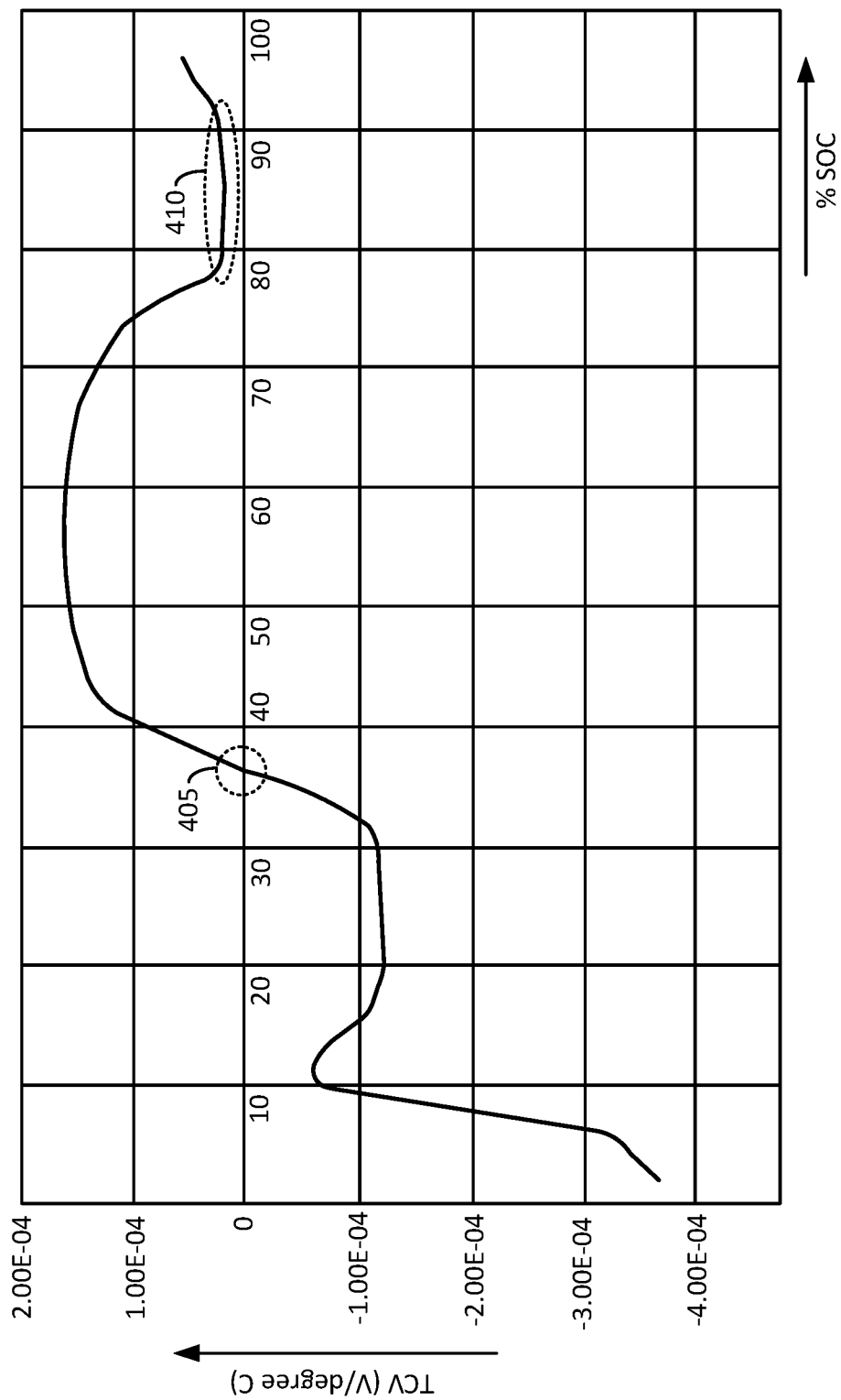
FIG. 4 shows a graphical representation of temperature coefficient of voltage (TCV) versus state-of-charge levels of an exemplary storage cell in accordance with the disclosure.

Attention is next drawn to FIG. 4, which shows a graphical representation of temperature coefficient of voltage (TCV) versus state-of-charge (SOC) levels of an exemplary storage cell in accordance with the disclosure. Lithium ion cells typically exhibit a significant TCV effect and it is desirable that the TCV effect be addressed prior to making self-discharge current measurements on lithium ion cells in order to obtain optimal measurement accuracy. One solution to minimizing adverse TCV effects is to immerse a lithium ion cell under test in a constant temperature fluid bath or temperature chamber. However, this approach may not be practical or desirable when carrying out measurements upon a batch of lithium ion cells in a production line of a manufacturing facility.

An alternative approach that eliminates the need to place a lithium ion cell in a constant temperature fluid bath or temperature chamber when carrying out self-discharge current measurements, is based on a relationship between the TCV characteristics and the SOC of the lithium ion cell. This relationship is used in accordance with an embodiment of the invention, to set an initial SOC of a lithium ion cell that nulls the TCV of the lithium ion cell and minimizes or eliminates the need to externally regulate the temperature of the lithium ion cell when carrying out self-discharge current measurements.

Setting of the initial SOC level of the lithium ion cell (such as the storage cell 230 shown in FIG. 3), can be carried out by generating and using the graphical representation shown in FIG. 4. The TCV, which is characterized in volts/degrees Celsius in this exemplary implementation, fluctuates in a range of positive and negative TCV values with respect to the SOC that is characterized in percentage terms. The graphical representation is obtained by executing a TCV characterization procedure that includes adjusting the SOC of a lithium ion cell in incremental steps (5% increments, for example) ranging from 0 to 100% SOC and measuring the corresponding TCV value for each SOC. The incremental steps can be selected on the basis of obtaining a desired level of accuracy for identifying zero TCV values and/or low TCV values prior to carrying out self-discharge current measurements.

Towards this end, a lithium ion cell is first placed at say 5% of a maximum SOC and then allowed to rest so as to allow for charge redistribution within the lithium ion cell to reach equilibrium. This is referred to as stand time and typically lasts a couple of days. After the stand time, the lithium ion cell is placed in a fluid bath or temperature chamber and cycled between at least two temperature levels. In one exemplary implementation, the two temperature levels are selected as percentage deviations from a nominal temperature level (+/−5% of 25 degrees Celsius, for example). The nominal temperature level can correspond to an operating temperature of the lithium ion cell during normal use later on. Sufficient stand time is provided at each of the two temperature levels after which a TCV measurement is carried out. Accordingly, two TCV measurements corresponding to the pair of temperature values are obtained for each SOC level.

The lithium ion cell is then placed at say 10% SOC level of the maximum SOC and the procedure repeated to obtain another two TCV measurements. The procedure is further repeated for each of the incremental SOC values up to the maximum SOC level (100%), and the TCV values obtained for the various SOC settings are used to generate the graphical representation shown in FIG. 4.

The dashed circle 405 indicates a TCV value of zero at around 37% SOC, while the dashed oval 410 indicates TCV values that are relatively close to the zero TCV value between about 78% SOC and about 90% SOC. In one exemplary implementation, the storage cell 230 (a lithium ion cell) can be set to an initial charge of about 37% of a maximum cell charge capacity (100%) and in another exemplary implementation, the storage cell 230 can be set to an initial charge that is below a predefined threshold TCV value, prior to starting a self-discharge current measurement in accordance with the disclosure. For example, when the predefined threshold TCV value is selected to correspond to 0.5E-04 V/degree C., the storage cell 230 can be set to an initial charge corresponding to any of the TCV values ranging from about 78% to about 90% of the maximum cell charge capacity.

Self-discharge current measurements in accordance with the disclosure can be carried out after setting the initial charge of the lithium ion cell in the manner described above so as to minimize or eliminate the need to externally regulate the temperature of the lithium ion cell.

Figure 5:
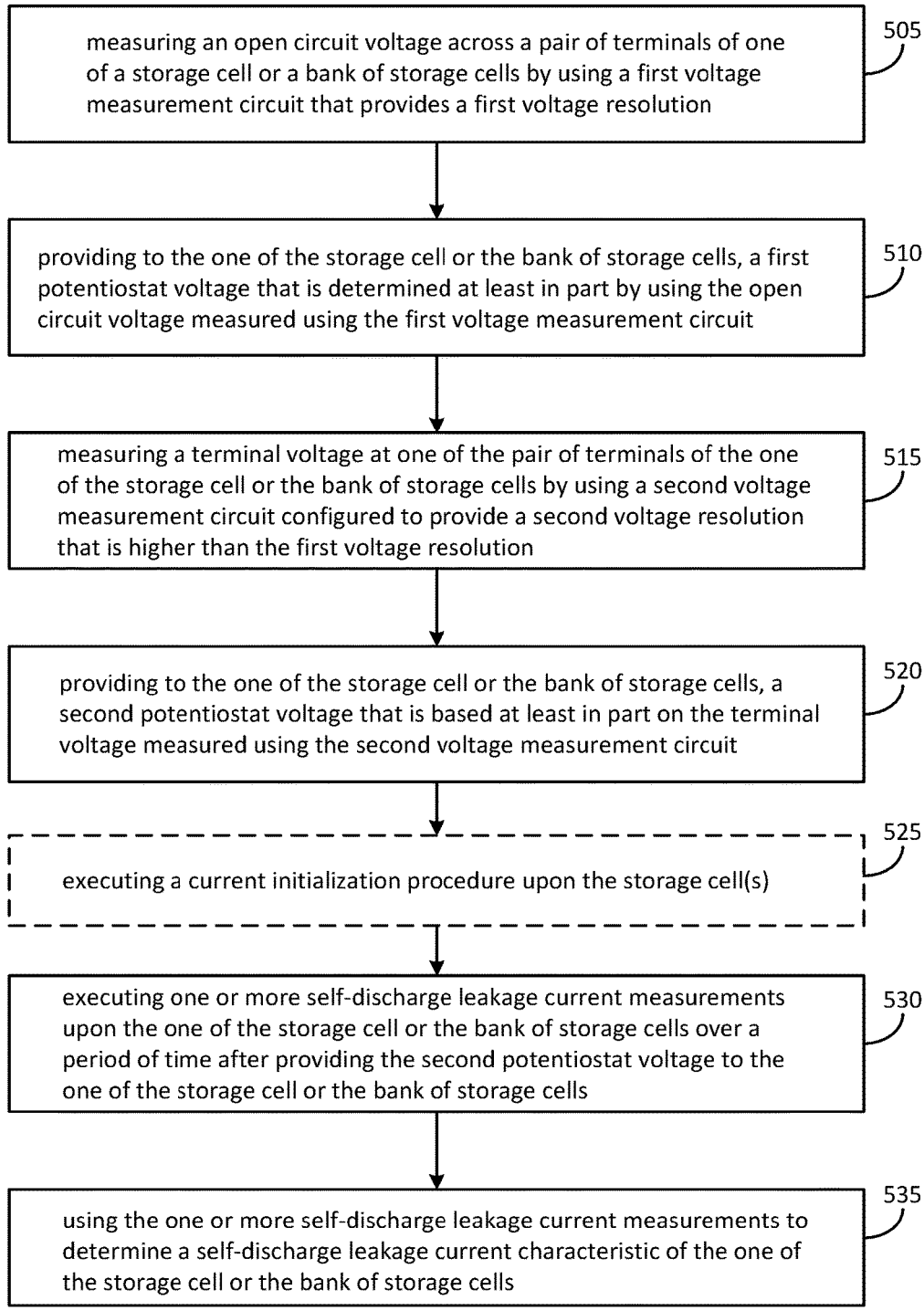
FIG. 5 shows a flowchart of an exemplary method to determine a self-discharge leakage current of a storage cell in accordance with the disclosure.

FIG. 5 shows a flowchart of an exemplary method to determine a self-discharge leakage current of a storage cell in accordance with the disclosure. It is to be understood that any method steps or blocks shown in FIG. 5 can represent modules, segments, or portions of code that include one or more executable instructions for implementing specific logical functions or steps in the method. In certain implementations, one or more of the steps may be performed manually. It will be appreciated that, although particular example method steps are described below, additional steps or alternative steps may be utilized in various implementations without detracting from the spirit of the disclosure. Moreover, steps may be executed out of order from that shown or discussed, including substantially concurrently or in reverse order, depending on various alternative implementations. Code may be also contained in one or more devices, and may not be necessarily confined to any particular type of device. The explanation below, while possibly implying code residency and functionality in certain devices, does so solely for the purposes of explaining concepts behind the disclosure, and should not be construed in a limiting manner.

The self-discharge current measurement system 200 that is shown in FIGS. 2 and 3 will be used below for purposes of describing the exemplary method. However, it must be understood that the method can be implemented using many other systems in accordance with the disclosure. It must also be understood that the functional blocks shown in FIG. 5 can be complemented or supplemented by other functional blocks. For example, prior to implementing block 505, various method steps can be carried out to set an initial state-of-charge of the storage cell for nulling the temperature coefficient of voltage of the storage cell and minimizing/eliminating the need to externally regulate the temperature of the storage cell.

Block 505 pertains to measuring an open circuit voltage across a pair of terminals of the storage cell 230 (or a bank of storage cells) by using the first voltage measurement circuit 215 that provides a first voltage resolution. The pair of terminals correspond to the positive and the negative terminals of the storage cell 230. The combination of the unity gain amplifier 325 and the ADC 320 provide for the first voltage resolution when measuring the open circuit voltage of the storage cell 230.

Block 510 pertains to providing to the storage cell 230, a first potentiostat voltage that is determined at least in part by using the open circuit voltage measured using the first voltage measurement circuit 215. The first potentiostat voltage is provided by the voltage source 210 under control of the processing unit 205.

Block 515 pertains to measuring a terminal voltage at one of the pair of terminals of the storage cell 230 cells by using the second voltage measurement circuit 220 that is incorporated into the multiplexed V-I circuit 355. The second voltage measurement circuit 220 is configured to provide a second voltage resolution that is higher than the first voltage resolution provided by the first voltage measurement circuit 215. Specifically, the second voltage resolution is provided by the combination of the high gain amplifier 335 and the ADC 330.

When carrying out the measurement of the terminal voltage, the multiplexed V-I circuit 355 is configured to operate in a voltage measurement mode by placing each of the switch 340 and the switch 345 to switch position 1. In this configuration, the negative terminal of the storage cell 230 is coupled into the positive input terminal of the high gain amplifier 335 and the current sense resistor 350 is left in an open condition (disconnected from the high gain amplifier 335).

Block 520 pertains to providing to the storage cell 230, a second potentiostat voltage that is based at least in part on the terminal voltage measured using the second voltage measurement circuit 220. The second potentiostat voltage that is provided by the voltage source 210 is based on a mismatch between the actual open circuit voltage of the storage cell 230 and the first potentiostat voltage that is coupled into the storage cell 230 based on the voltage measurement carried out by the first voltage measurement circuit 215. The mismatch voltage can be measured between the negative terminal of the storage cell 230 and ground (as a result of the potentiostat voltage being referenced to ground) after each of the switch 340 and the switch 345 is placed in switch position 1.

The mismatch voltage can be referred to by using alternative labels such as a residual voltage, an offset voltage, or a difference voltage. The procedure used to rectify the mismatch can also be referred to in various alternative ways, such as a residual voltage correction, a vernier voltage adjustment, or a second-pass potentiostat voltage setting procedure.

The second voltage measurement circuit 220 provides a second voltage resolution that is significantly higher than the first voltage resolution. Thus, the second voltage resolution allows the processing unit 205 to use the second voltage measurement circuit 220 to identify the mismatch voltage with greater accuracy.

Block 525 pertains to a current initialization procedure that can be optionally performed in some embodiments and omitted in some others. The procedure, which can be executed after the voltage source 210 has provided the second potentiostat voltage to the storage cell 230, is directed at rapidly configuring the self-discharge current measurement system 200 to begin potentiostatic regulation with a predetermined initial current flowing through the storage cell 230. In one implementation, the predetermined initial current can be a typical self-discharge current of the storage cell 230 that is already known based on information such as past history, previous test evaluations, data sheets, empirical data, and/or theoretical data. In another implementation, the predetermined initial current can be a current that is specified by an entity such as a customer or a test operator.

The current initialization procedure can be carried out by placing each of the switch 340 and the switch 345 to switch position 2 and using the multiplexed V-I circuit 355 to measure a first self-discharge current in the storage cell 230 as a result of the voltage source 210 providing the second potentiostat voltage to the storage cell 230. The processing unit calculates a difference between the first self-discharge current and the predetermined initial current to determine a first digital control word to apply to the DAC 310 via the binary interface 306. The DAC 310, in conjunction with the other components of the voltage source 210 provides a third potentiostat voltage to the storage cell 230 for modifying the self-discharge current to match the predetermined initial current.

In some implementations, the level of accuracy obtained by providing the third potentiostat voltage to the storage cell 230 may be adequate and the current initialization procedure can be terminated at this stage. However, in some other implementations, a higher level of accuracy may be desired. Consequently, the multiplexed V-I circuit 355 and the voltage source 210 can be further used in an iterative and/or recursive manner by the processing unit 205 for setting the predetermined initial current.

Setting the initial current in the storage cell 230 to the predetermined value can be carried out over a short period of time, such as in about a minute, and leads to a significant reduction in the overall duration of a test to determine the self-discharge current characteristic of the storage cell 230, particularly in comparison to several traditional test procedures.

Block 530 pertains to executing one or more self-discharge leakage current measurements upon the storage cell 230 over a period of time after execution of block 520 (followed by block 525, if desired). The self-discharge leakage current measurements are typically carried out after allowing the second potentiostat voltage to remain coupled into the storage cell 230 for a period of time that is sufficient for the voltage source 210 and the storage cell 230 to reach equilibrium. At equilibrium, the self-discharge current is fully provided by the voltage source 210, which has by now taken over the self-discharge current typically provided by the internal cell capacity of the storage cell 230.

When performing a measurement of the self-discharge current flowing through the storage cell 230, the multiplexed V-I circuit 355 is configured to operate in a current measurement mode by placing each of the switch 340 and the switch 345 to switch position 2. In this configuration, the negative terminal of the storage cell 230 is coupled into the positive input terminal of the high gain amplifier 335 and the current sense resistor 350 is also connected to the positive input terminal of the high gain amplifier 335. The self-discharge current flowing through the storage cell 230 passes through the current sense resistor 350 to ground. The high gain amplifier 335 amplifies the resulting voltage drop across the current sense resistor 350. The output voltage of the high gain amplifier 335 is thus directly proportional to an amplitude of the self-discharge current flowing through the storage cell 230 and the current sense resistor 350.

The settling time associated with the self-discharge current flowing through the current sense resistor 350 is governed by a time constant formed between the current sense resistor 350 and an effective capacitance of the storage cell 230. The effects of the time constant can be taken into consideration when processing the output of the ADC 330 by the processing unit 205 to determine the self-discharge leakage current characteristic of the storage cell 230. In one exemplary implementation, a small offset voltage can be provided by the voltage source 210 to the storage cell 230 to offset at least some portion of the impact created by the current sense resistor 350 upon the measurements. The offset voltage can be set on the basis of an expected amplitude of the self-discharge current flowing in the storage cell 230 or based on execution of the block 525 described above. In some other exemplary embodiments, the current sense resistor 350 can be provided in the form of a controllable resistive element that can be controlled by the processing unit 205 for example, in order to vary a resistance value of the current sense resistor 350. In another exemplary implementation, the controllable resistive element can be a separate device that is coupled in series with the current sense resistor 350. In yet another exemplary implementation, a virtual series resistance can be added to, or subtracted from, the current sense resistor 350, via a software program executed by the processing unit 205.

Block 535 pertains to using the one or more self-discharge leakage current measurements to determine a self-discharge leakage current characteristic of the storage cell 230. The processing unit 205, which can be used for this purpose, can be incorporated into a measurement apparatus that includes the self-discharge current measurement system 200. In some alternative embodiments, the processing unit 205 can be incorporated into a computing system that is communicatively coupled to the self-discharge current measurement system 200.

In summary, it should be noted that the invention has been described with reference to a few illustrative embodiments for the purpose of demonstrating the principles and concepts of the invention. It will be understood by persons of skill in the art, in view of the description provided herein, that the invention is not limited to these illustrative embodiments. For example, it will be understood that though the storage cell 230 is referred to as a lithium ion cell in several places, the self-discharge current measurement system 200 can be used to measure the self-discharge leakage current characteristic of many other types of storage cells. Persons of skill in the art will understand that many such variations can be made to the illustrative embodiments without deviating from the scope of the invention.

What is claimed is:

1. A method comprising:
measuring an open circuit voltage across a pair of terminals of one of a storage cell or a bank of storage cells by using a first voltage measurement circuit that provides a first voltage resolution;
providing to the one of the storage cell or the bank of storage cells, a first potentiostat voltage that is determined at least in part by using the open circuit voltage measured using the first voltage measurement circuit;
measuring a terminal voltage, with reference to ground, at one of the pair of terminals of the one of the storage cell or the bank of storage cells by using a second voltage measurement circuit configured to provide a second voltage resolution that is higher than the first voltage resolution;
providing to the one of the storage cell or the bank of storage cells, a second potentiostat voltage that is based at least in part on the terminal voltage measured using the second voltage measurement circuit;
executing one or more self-discharge leakage current measurements upon the one of the storage cell or the bank of storage cells over a period of time after providing the second potentiostat voltage to the one of the storage cell or the bank of storage cells; and using the one or more self-discharge leakage current measurements to determine a self-discharge leakage current characteristic of the one of the storage cell or the bank of storage cells.

2. The method of claim 1, wherein the first voltage measurement circuit provides a millivolt level of resolution and the second voltage measurement circuit provides a microvolt level of resolution, and wherein the one of the pair of terminals is a negative terminal of the one of the storage cell or the bank of storage cells.

3. The method of claim 2, wherein the millivolt level of resolution is obtained at least in part, by using one of a low gain or a unity gain amplifier, and the microvolt level of resolution is obtained at least in part, by using a high gain amplifier.

4. The method of claim 1, further comprising:
executing a temperature coefficient of voltage (TCV) characterization procedure upon the one of the storage cell or the bank of storage cells prior to measuring the open circuit voltage across the pair of terminals, the TCV characterization procedure comprising identifying at least one of a zero TCV value or one or more TCV values that are below a predefined threshold.

5. The method of claim 4, wherein executing the TCV characterization procedure comprises:
setting the one of the storage cell or the bank of storage cells to each of a plurality of state-of-charge (SOC) levels;
cycling the one of the storage cell or the bank of storage cells between at least two temperature levels when set to each of the plurality of SOC levels;
determining a plurality of TCV values corresponding to the plurality of SOC levels when cycling the one of the storage cell or the bank of storage cells between the at least two temperature levels; and
using the plurality of TCV values for identifying the at least one of the zero TCV value or the one or more TCV values that are below the predefined threshold.

6. The method of claim 5, wherein identifying the at least one of the zero TCV value or the one or more TCV values that are below a predefined threshold comprises using a graphical representation of the plurality of TCV values versus the plurality of SOC levels.

7. The method of claim 4, further comprising:
using the at least one of the zero TCV value or the one or more TCV values that are below the predefined threshold to set an initial state-of-charge (SOC) level of the one of the storage cell or the bank of storage cells prior to measuring the open circuit voltage across the pair of terminals.

8. A method comprising:
executing a temperature coefficient of voltage (TCV) characterization procedure upon one of a storage cell or a bank of storage cells for determining a TCV characteristic of the one of the storage cell or the bank of storage cells; and
using the TCV characteristic to set an initial state-of-charge (SOC) level of the one of the storage cell or the bank of storage cells prior to executing a test procedure for determining a self-discharge leakage current characteristic of the one of the storage cell or the bank of storage cells, the test procedure comprising:
providing two or more voltage measurement circuits;
using one of the two or more voltage measurement circuits to measure an open circuit voltage across a pair of terminals of the one of the storage cell or the bank of storage cells, the one of the two or more voltage measurement circuits providing a first voltage resolution;
providing to the one of the storage cell or the bank of storage cells, a first potentiostat voltage having a voltage amplitude that matches the open circuit voltage measured using the one of the two or more voltage measurement circuits;
executing one or more self-discharge leakage current measurements upon the one of the storage cell or the bank of storage cells over a period of time after at least providing the first potentiostat voltage to the one of the storage cell or the bank of storage cells; and
using the one or more self-discharge leakage current measurements to determine the self-discharge leakage current characteristic of the one of the storage cell or the bank of storage cells.

9. The method of claim 8, further comprising:
prior to executing the one or more self-discharge leakage current measurements, using another one of the two or more voltage measurement circuits to measure a terminal voltage at one of the pair of terminals of the one of the storage cell or the bank of storage cells, the another one of the two or more voltage measurement circuits providing a second voltage resolution that is higher than the first voltage resolution; and
prior to executing the one or more self-discharge leakage current measurements, providing to the one of the storage cell or the bank of storage cells, a second potentiostat voltage that is based at least in part on the terminal voltage at the one of the pair of terminals.

10. The method of claim 9, wherein the one of the two or more voltage measurement circuits includes a first analog-to-digital converter (ADC) and one of a low gain or a unity gain amplifier; and the another one of the two or more voltage measurement circuits includes a second ADC and a high gain amplifier.

11. The method of claim 10, wherein the another one of the two or more voltage measurement circuits is a dual-function circuit comprising one or more switches that are controlled by a processing unit for measuring one of the terminal voltage at the one of the pair of terminals of the one of the storage cell or the bank of storage cells or a self-discharge leakage current of the one of the storage cell or the bank of storage cells.

12. The method of claim 8, wherein executing the TCV characterization procedure comprises:
setting the one of the storage cell or the bank of storage cells to each of a plurality of state-of-charge (SOC) levels;
cycling the one of the storage cell or the bank of storage cells between at least two temperature levels when set to each of the plurality of SOC levels; and
determining a plurality of TCV values corresponding to the plurality of SOC levels when cycling the one of the storage cell or the bank of storage cells between the at least two temperature levels.

13. The method of claim 8, wherein using the TCV characteristic to set the initial SOC level of the one of the storage cell or the bank of storage cells comprises:
using the TCV characteristic of the one of the storage cell or the bank of storage cells to identify at least one of a zero TCV value or one or more TCV values that are below a predefined threshold; and
setting the initial SOC level of the one of the storage cell or the bank of storage cells based at least in part on the at least one of the zero TCV value or the one or more TCV values that are below the predefined threshold.

14. A system comprising:
a first voltage measurement circuit that provides a first voltage resolution for measuring an open circuit voltage across a pair of terminals of one of a storage cell or a bank of storage cells;
a second voltage measurement circuit that provides a second voltage resolution for measuring a terminal voltage with reference to ground at one of the pair of terminals of the one of the storage cell or the bank of storage cells;
a current measurement circuit for measuring one or more self-discharge leakage currents of the one of the storage cell or the bank of storage cells; and
a processor coupled to the first voltage measurement circuit, the second voltage measurement circuit, and the current measurement circuit for executing a test procedure to determine a self-discharge leakage current characteristic of the one of the storage cell or the bank of storage cells.

15. The system of claim 14, wherein the first voltage measurement circuit comprises a first analog-to-digital converter (ADC) and one of a low gain amplifier or a unity gain amplifier that couples the open circuit voltage of the one of the storage cell or the bank of storage cells into the first ADC, and the second voltage measurement circuit comprises a second ADC and a high gain amplifier.

16. The system of claim 15, wherein the second voltage measurement circuit and the current measurement circuit are provided as a dual-function circuit that executes one or more functions of the second voltage measurement circuit and the current measurement circuit on a time-multiplexed basis.

17. The system of claim 15, further comprising a voltage source that is controllable by the processor for providing one or more potentiostat voltages to the one of the storage cell or the bank of storage cells.

18. The system of claim 17, wherein the voltage source comprises:
a digital-to-analog converter (DAC) configurable by the processor to generate the one or more potentiostat voltages; and
a unity gain amplifier coupled to the DAC, the unity gain amplifier configured to provide the one or more potentiostat voltages to the one of the storage cell or the bank of storage cells.

19. The system of claim 18, wherein each of the first ADC and the second ADC is a 12-bit ADC.

20. The system of claim 14, wherein the second voltage resolution is higher than the first voltage resolution, and wherein the one of the storage cell or the bank of storage cells comprises a rechargeable lithium ion cell.

* * * * *